US007304492B2

(12) United States Patent
Shiau et al.

(10) Patent No.: US 7,304,492 B2

(45) Date of Patent: Dec. 4, 2007

(54) INSPECTING CIRCUIT LAYOUT FOR LCD PANEL AND FABRICATING METHOD FOR LCD PANEL

(75) Inventors: Fu-Yuan Shiau, Chiayi (TW); Chih-Yu Chen, Banciao (TW); Meng-Chi Liou, Taoyuan (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/369,370

(22) Filed: Mar. 6, 2006

(65) Prior Publication Data

US 2007/0205754 A1 Sep. 6, 2007

(51) Int. Cl.
*G01R 31/00* (2006.01)
*G01R 31/02* (2006.01)
*G02F 1/136* (2006.01)

(52) U.S. Cl. ..................... 324/770; 324/158.1; 349/43; 349/54

(58) Field of Classification Search ................. 324/770
See application file for complete search history.

(56) References Cited

U.S. PATENT DOCUMENTS 5,668,032 A * 9/1997 Holmberg et al. .......... 438/149
6,025,891 A * 2/2000 Kim ............................ 349/40
6,100,949 A 8/2000 Kim ............................ 349/40
6,128,051 A 10/2000 Kim et al. ..................... 349/40
6,437,596 B1 * 8/2002 Jenkins et al. .............. 324/770
6,642,972 B2 11/2003 Yoo et al. ...................... 349/40
6,759,867 B2 * 7/2004 Sohn .......................... 324/770
6,778,230 B2 8/2004 Park et al. ..................... 349/40
6,956,396 B2 * 10/2005 Lai et al. .................... 324/770
2003/0210359 A1 11/2003 Lee et al. ...................... 349/43
2004/0124869 A1 * 7/2004 Lee et al. ................... 324/770

* cited by examiner

*Primary Examiner*—Ha Tran Nguyen
*Assistant Examiner*—Emily Y Chan
(74) *Attorney, Agent, or Firm*—J.C. Patents

(57) ABSTRACT

An inspecting circuit layout according to the present invention is provided. The inspecting circuit layout is adapted for inspecting panel units group by group, each of the panel units having a plurality of first and second signal lines. The inspecting circuit layout includes a multiplexer (MUX) and an inspecting pad. The MUX is electrically connected with at least one of the first or second signal lines of the panel units, and the inspecting pad is electrically connected to the MUX. The MUX is adapted for selectively connecting the inspecting pad with the first or second signal lines of a group of panel units.

12 Claims, 11 Drawing Sheets

INSPECTING CIRCUIT LAYOUT FOR LCD PANEL AND FABRICATING METHOD FOR LCD PANEL

BACKGROUND OF THE INVENTION

1. Field of the Invention

The present invention relates to an inspecting technology for a display panel, and particularly to an inspecting circuit layout for a liquid crystal display (LCD) panel and a fabricating method for such an LCD panel.

2. Description of Related Art

The fast development of multi-media technology can be attributed to the progress in semiconductor components and display devices. As to display devices, LCDs, with such advantages as high pixel quality, good spatial utilization, low power consumption and no radiation, have become a mainstream product in the display market.

FIG. 1 is an exploded schematic view of a conventional active matrix (AM) LCD panel. Referring to FIG. 1, the AM-LCD panel 100 includes an active element array substrate 110, a liquid crystal layer 120 and a color filter 130. The color filter 130 is disposed over the active element array substrate 110. The liquid crystal layer 120 is disposed between the active element array substrate 110 and the color filter 130. The active element array substrate 110 has a plurality of active elements 112 distributed as an array thereon, and a plurality of pixel electrodes 114. Each active element 112 corresponds to a given pixel electrode 114, the active element 112 serving as a switch for a pixel unit. In order to drive active elements 112 of a given pixel unit, a scan line 116 and a data line 118 are typically used for selecting the given pixel unit and providing an appropriate voltage to display a corresponding frame.

FIG. 2 is a schematic view of a conventional inspecting circuit layout for panel units. Referring to FIG. 2, the AM-LCD panel 100 of FIG. 1 is fabricated by a process including: assembling a large area of active element array substrate with a large area of color filter for enclosing a liquid crystal layer therebetween, therefore a plurality of panel units 200 distributed as an array is formed; and then performing a cutting process to form a plurality of the AM-LCD panels 100 of FIG. 1.

In order to inspect the electric characteristic of the conventional panel units 200, shorting bars 140 are employed for connecting scan lines and data lines of each panel unit 200 with the scan lines and data lines of the other panel units in series, respectively, and each shorting bar 140 being electrically connected to a pad 210. A probe (not shown) is pressed against the pad 210, such that signals can be input to the scan lines of the panel units via the probe, thus triggering the active elements 112 of FIG. 1. Thereafter, inspecting signals are transferred to the data lines of the panel units 200 via the probe. The panel units 200 can display frames according to the inspecting signals. Therefore, operators can identify whether the panel units 200 are qualified or not according to the displayed frames.

For fabricating small-sized display panel, a piece of glass substrate can be made into tens or hundreds of panel units. As shown in FIG. 2, in order to simultaneously inspect the electrical characteristics of the panel units 200, the panel units 200 have to be constantly charged and the probe (not shown) pressed against the pad 210 to transfer the inspecting signals to each of the panel units 200. In other words, during such an inspecting process, all of the active elements (not shown) in the panel units 200 are at ON state. After the all of the panel units are inspected, all of the active elements (not shown) in the panel units 200 are turned to OFF state.

According to the foregoing inspecting methods, only one set of probes pressing against the pad 210 is needed for inspecting all of the panel units 200. However, having maintained an on state for a long time, the active elements are likely to have characteristics variations and may not operate properly.

In solution, another conventional inspecting method is proposed. FIG. 3 is a schematic view of another conventional inspecting circuit layout for panel units. Referring to FIG. 3, the panel units 200 are divided into a plurality of groups, each group panel units being respectively electrically connected to a corresponding pad 300. Consequently, when inspecting the panel units 200, only the group of panel units to be inspected is needed to be charged and the probe (not shown) pressing against the pad 300 transfers the inspecting signals into each of the panel units 200. After the group of panel units is inspected, the active elements of the group of panel units can be turned to OFF state. In other words, such an inspecting method is adapted for shortening the ON-state time of the active elements.

However, the inspecting method can inspect only one group of panel unit in one time. Therefore, after inspecting one group of panel units, the probe has to be moved to another pad corresponding to the next group of panel units, calibrated, to accurately press against the pad. Therefore, more groups of panel units would require for more inspecting time for all of the panel units. Although using more probes may allow more groups of panel units to be inspected at same time and shorten the inspecting time, the corresponding inspecting cost is also increased.

SUMMARY OF THE INVENTION

An object of the invention is to provide an inspecting circuit layout, adapted for shortening the inspecting time for an individual panel unit or individual group of panel units.

Another object of the invention is to provide a method for fabricating LCD panel, for shortening the light inspection of LCD panels of a same batch.

For achieving the foregoing objects and others, the invention provides an inspecting circuit layout, adapted for inspecting an individual panel unit or individual group of panel units. Wherein, each of the panel units has a plurality of first signal lines and second signal lines. The inspecting circuit layout includes a first multiplexer (MUX) and a first inspecting pad. The first MUX is electrically connected with the first signal lines of the panel units, and the first inspecting pad is electrically connected to the first MUX. The first MUX is adapted for selectively connecting the first inspecting pad with first signal lines of a group of panel units.

According an embodiment of the invention, the first signal lines are scan lines and the second signal lines are data lines.

According an embodiment of the invention, the foregoing inspecting circuit layout further includes a plurality of first shorting bars electrically connected with the foregoing first MUX, each first shorting bar being electrically connected in series with a part or all of the first signal lines of the corresponding group of panel units. For example, these first shorting bars include a plurality of first odd shorting bars and a plurality of first even shorting bars, and each of the first odd shorting bars is electrically connected with the odd first signal lines of a group of the panel unit, and each of the first even shorting bars is electrically connected with the even first signal lines of a group of the panel unit.

According to an embodiment of the invention, the foregoing inspecting circuit layout further includes a plurality of protecting devices for preventing electrostatic discharge (ESD) damage, each protecting device being electrically connected between the corresponding first shorting bar and the first signal lines of the group of panel units.

According to an embodiment of the invention, the foregoing first MUX includes a plurality of first control transistors. Each of the first control transistors includes a gate electrode electrically connected with the first inspecting pad, and a source electrode of each of the first control transistor electrically connected with the first signal lines of the corresponding group of panel units.

According to an embodiment of the invention, the foregoing inspecting circuit layout further includes a first refresh signal supplying unit, electrically connected to the foregoing first MUX. The foregoing first MUX further includes a plurality of first refresh transistors. Each of the first refresh transistors includes a source electrode electrically connected between the source electrode of a corresponding first control transistor and the first signal lines, and a drain electrode electrically connected to the foregoing first refresh signal supplying unit.

According to an embodiment of the invention, the foregoing inspecting circuit layout further includes a second MUX and a second inspecting pad. The second MUX is electrically connected with the second signal line of the panel units, and the second inspecting pad is electrically connected with the second MUX. The second MUX is adapted for conducting the second inspecting pad with the second signal line of a group of the panel unit selectively.

According to an embodiment of the invention, the foregoing inspecting circuit layout further includes a plurality of second shorting bar electrically connected with the foregoing second MUX, each of the second shorting bars being electrically connected in series with a part or all of the second signal lines of the corresponding group of panel units. For example, these second shorting bars include a plurality of second odd shorting bars and a plurality of second even shorting bars, and each of the second odd shorting bars is electrically connected with the odd second signal lines of a group of the panel unit, and each of the second even shorting bars is electrically connected with the even second signal lines of a group of the panel unit.

According to an embodiment of the invention, the foregoing inspecting circuit layout further includes a plurality of protecting devices for preventing electrostatic discharge (ESD) damage, each protecting device being electrically connected between the corresponding second shorting bar and the second signal lines of the group of panel units.

According to an embodiment of the invention, the foregoing second MUX includes a plurality of second control transistors. Each of the second control transistors includes a drain electrode electrically connected with the second inspecting pad, and a source electrode electrically connected with the second signal lines of the corresponding group of panel units.

According to an embodiment of the invention, the foregoing inspecting circuit layout further includes a second refresh signal supplying unit, electrically connected to the foregoing second MUX. The foregoing second MUX further includes a plurality of second refresh transistors. Each of the second refresh transistors includes a source electrode electrically connected between the source electrode of a corresponding second control transistor and the second signal lines, and a drain electrode electrically connected to the foregoing second refresh signal supplying unit.

The invention also provides a method for fabricating an LCD panel. The method includes: forming a liquid crystal layer on a first substrate; then providing a second substrate; then assembling the first substrate and the second substrate for enclosing the liquid crystal layer therebetween and forming a plurality of groups of panel units; thereafter, forming a foregoing inspecting circuit layout; then inputting a lighting signal into the inspecting circuit layout and performing lighting inspection to these group of panel units; after the inspection is completed, cutting the assembled first substrate and second substrate to form a plurality of LCD panels.

According to an embodiment of the invention, the method for forming the foregoing liquid crystal layer is a one drop fill (ODF) process.

According to an embodiment of the invention, the method for fabricating an LCD panel further includes: before forming the foregoing liquid crystal layer, forming a sealant for forming a plurality of liquid crystal filling zones on the first substrate, where the liquid crystal layer are subsequently formed. The method for assembling the first substrate and the second substrate for example is by pressing the first substrate and the second substrate and then solidifying the sealant. The method for solidifying the sealant for example is either a hot solidifying process or an ultraviolet solidifying process.

The inspecting circuit layout of the invention employs an MUX to selectively connect a part of the panel units with the inspecting pad for inspecting the panel units group by group. Therefore, the inspection process of all the panel units can be completed without moving the probes.

BRIEF DESCRIPTION OF THE DRAWING

The features of the invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DESCRIPTION OF THE EMBODIMENTS

Figure 1:
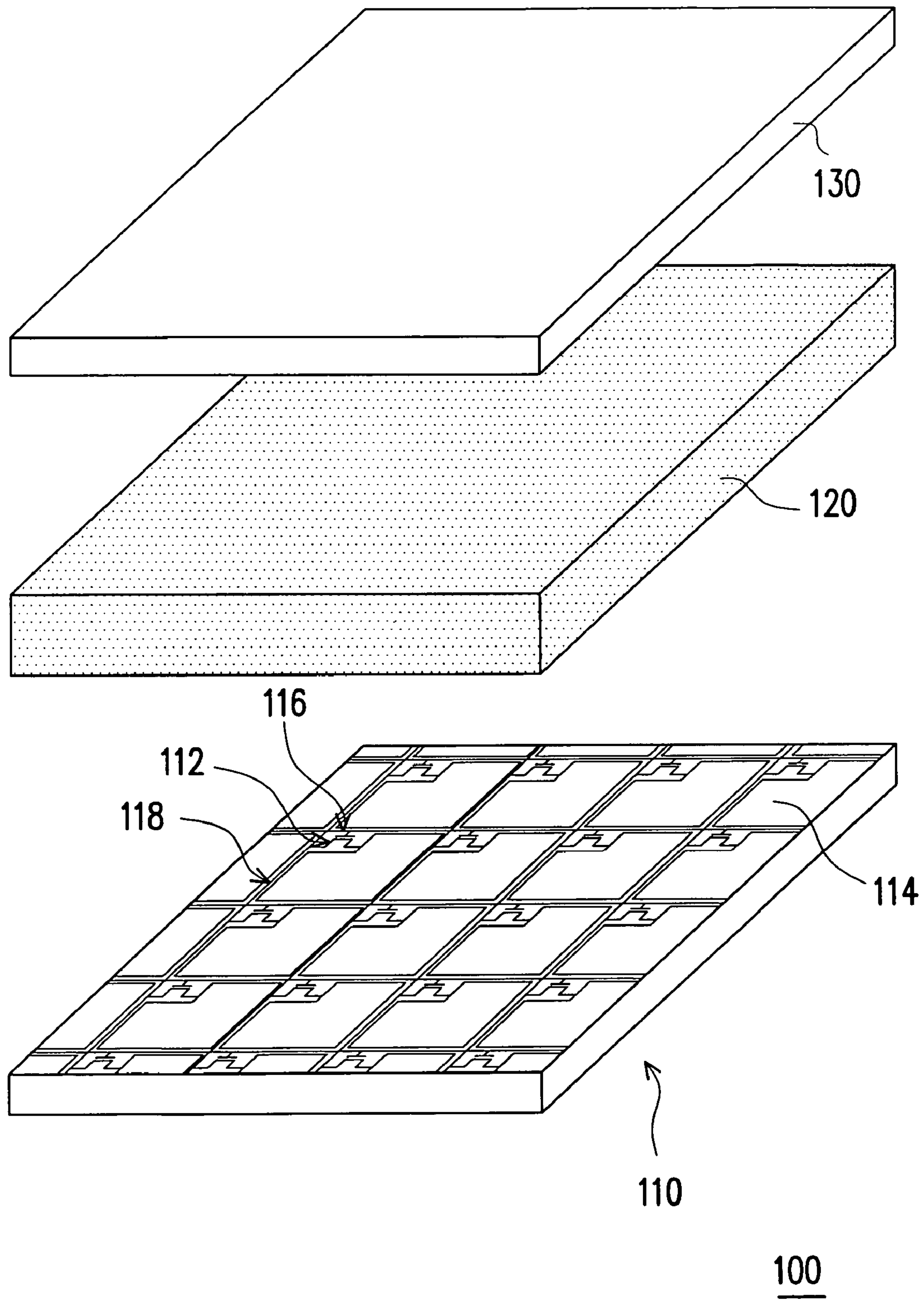
FIG. 1 (PRIOR ART)
FIG. 1 is an exploded schematic view of a conventional active matrix (AM) LCD panel.
Figure 2:
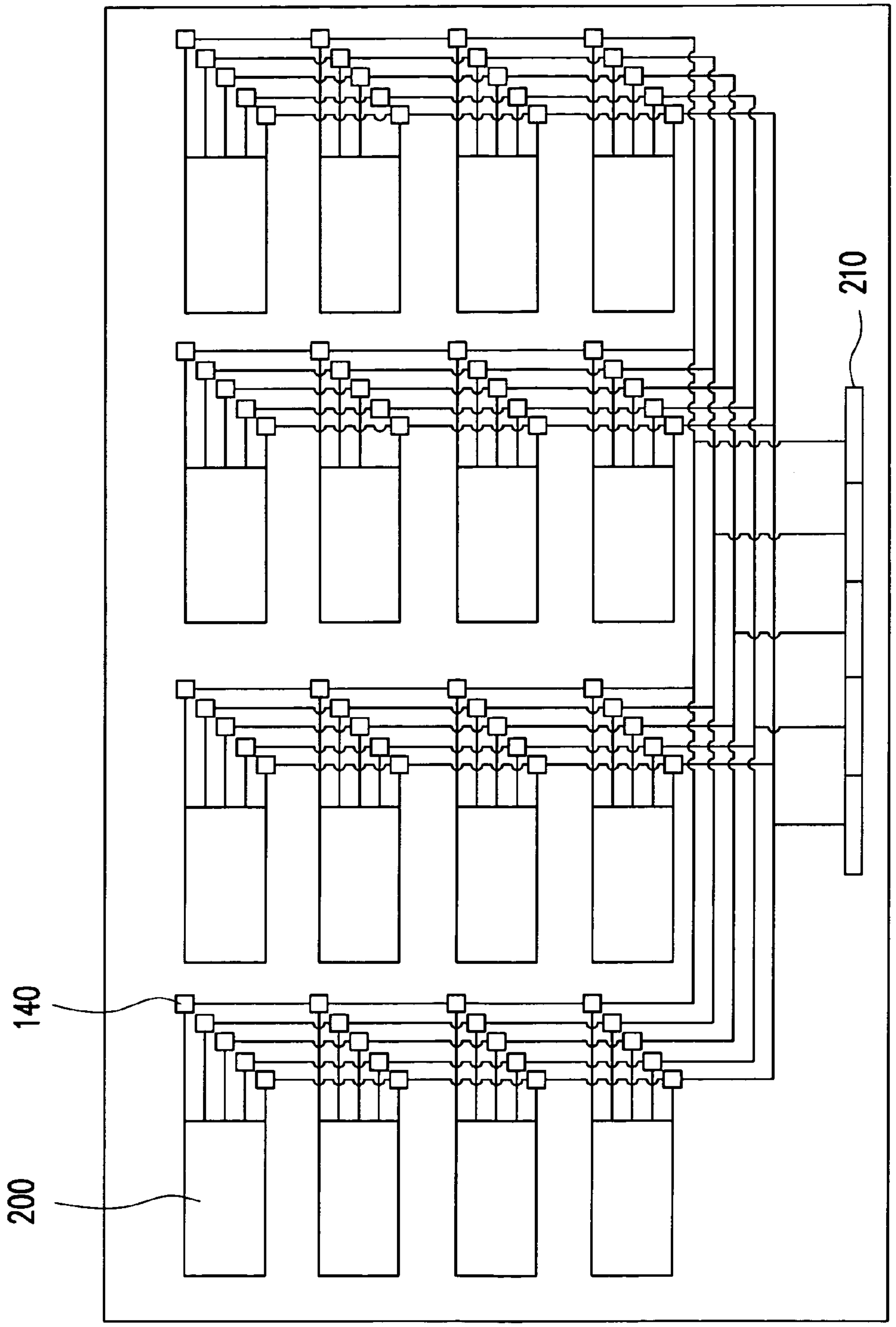
FIG. 2 (PRIOR ART)
FIG. 2 is a schematic view of a conventional inspecting circuit layout for panel units.
Figure 3:
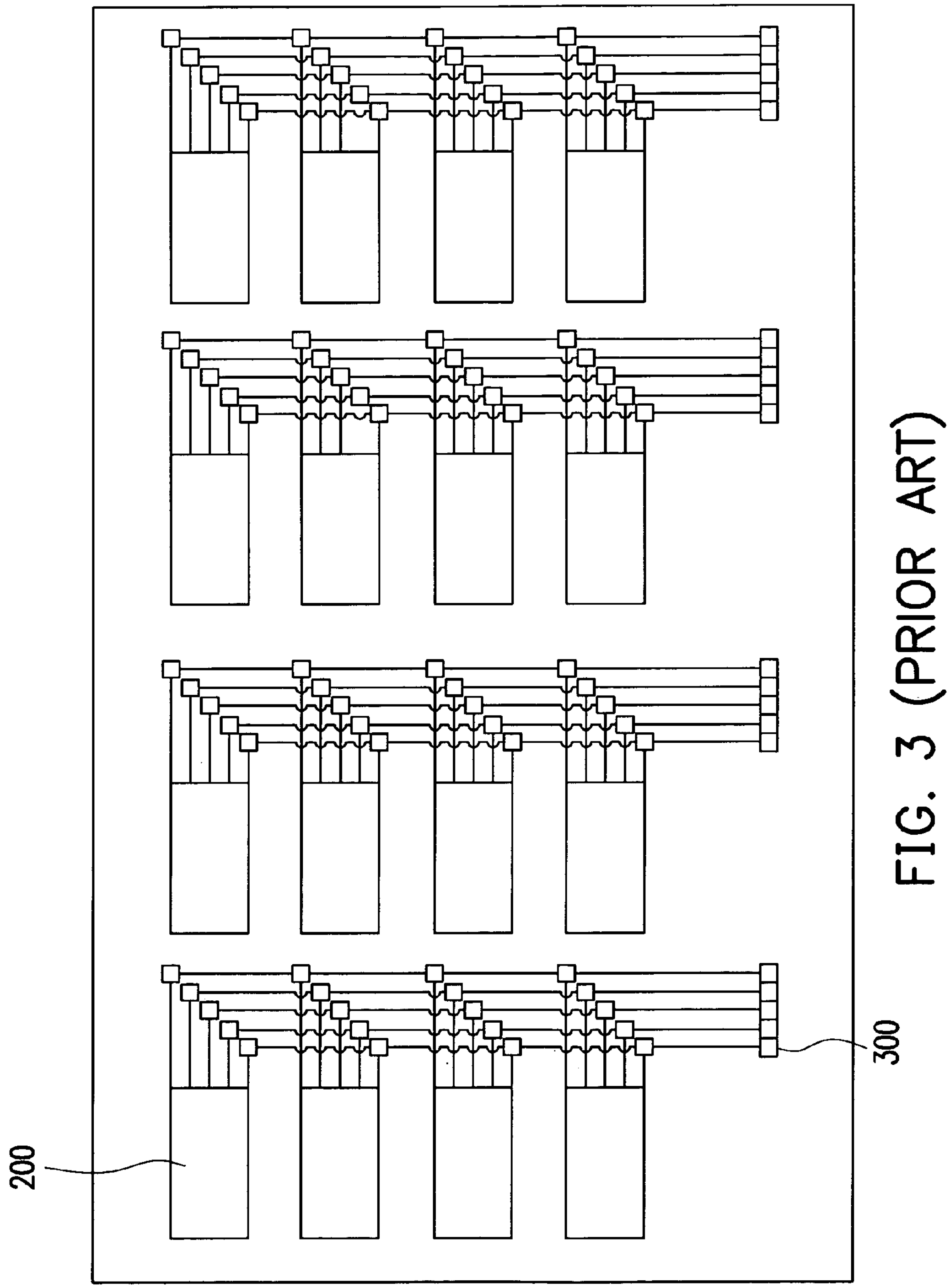
FIG. 3 (PRIOR ART)
FIG. 3 is a schematic view of another conventional inspecting circuit layout for panel units.
Figure 4:
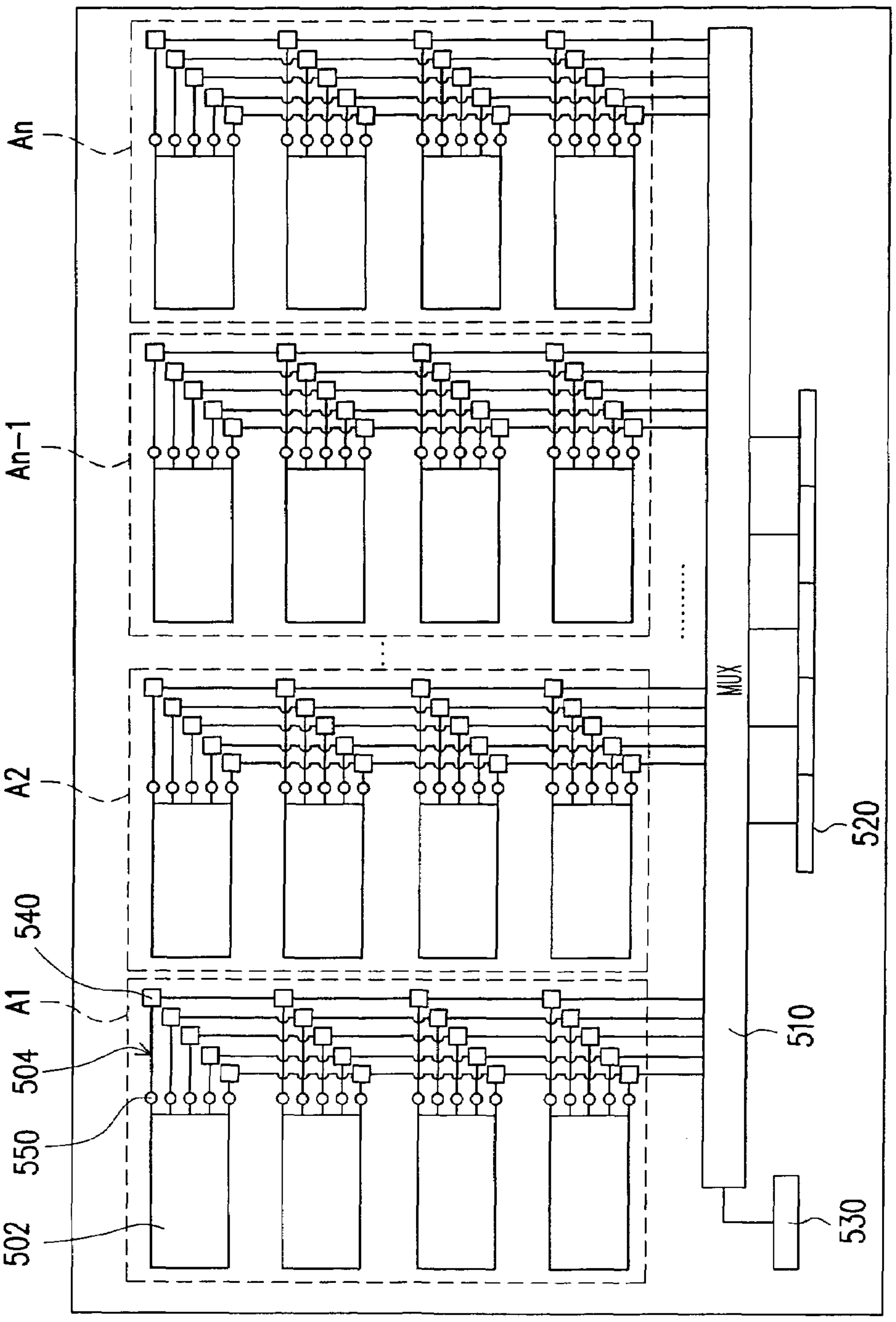
FIG. 4 is a schematic view of an inspecting circuit layout for panel unit according to a first embodiment of the invention.

FIG. 4 is a schematic view of an inspecting circuit layout for panel unit according to a first embodiment of the invention. Referring to FIG. 4, the inspecting circuit layout 500 is adapted for inspecting a plurality of panel units 502. Each of the panel units 502 includes a plurality of first signal lines 504*a* and second signal lines 504*b*, respectively. The panel units 502 receive input inspecting signals from the inspecting circuit layout 500 via the first signal lines 504*a* and the second signal lines 504*b*. In this embodiment, the first signal lines 504*a* are the scan lines, and the second signal lines 504*b* are the data lines.

As shown in FIG. 4, the inspecting circuit layout 500 includes a MUX 510 and an inspecting pad 520. The inspecting pad 520 is adapted for receiving inspecting signals for inspecting the panel units 502, and is electrically connected to the MUX 510. The MUX 510 is electrically connected between the inspecting pad 520 and the first signal lines 504*a* of the panel units 502 for selectively connecting the inspecting pad 520 with first signal lines 504*a* of a group of panel units 502 to be inspected. Therefore, the inspecting signals can be transferred from the inspecting pad 520 to the group of panel units 502 via the first signal lines 504*a*. Besides, a selective signal SS for controlling the MUX 510 is transmitted to the MUX 510 through a selective signal pad 530 electrically connected with the MUX 510.

It is to be noted that the first signal lines 504*a* of each group of panel units 502 for example are electrically connected in series to each other via a shorting bars 540, and the MUX 510 is also electrically connected with the first signal lines 504*a* of the panel units 502 via the shorting bars 540. Accordingly, the signals output from the MUX 510 can be simultaneously transferred to all of the panel units 502 of the same given group via the shorting bar 540. Wherein, these shorting bars 540 include odd shorting bars 540*o* and even shorting bars 540*e*. The odd first signal lines 504*a* can be conducted with one another via the odd shorting bar 540*o*; the even first signal lines 504*a* can be conducted with one another via the even shorting bar 540*e*. In the present invention, the occurrence of a short circuit between the even first signal lines 504*a* or the odd first signal lines 504*a* is not limited in the present invention. In another embodiment, all of the first signal lines 504*a* can be conducted with one another, otherwise, the first signal lines 504*a* can be conducted with one another group by group in other manner.

Additionally, a protecting device 550 for preventing ESD damage can be connected between each shorting bar 540*o* or shorting bar 540*e* and the corresponding first signal lines 504*a*, for providing a path allowing the static charges of the panel units 502 to be released and avoiding the panel units 502 from the damage of accumulated static charges.

Electrical components of the MUX 510 are described below for further explaining the operating scheme of the MUX 510 in details.

Figure 5:
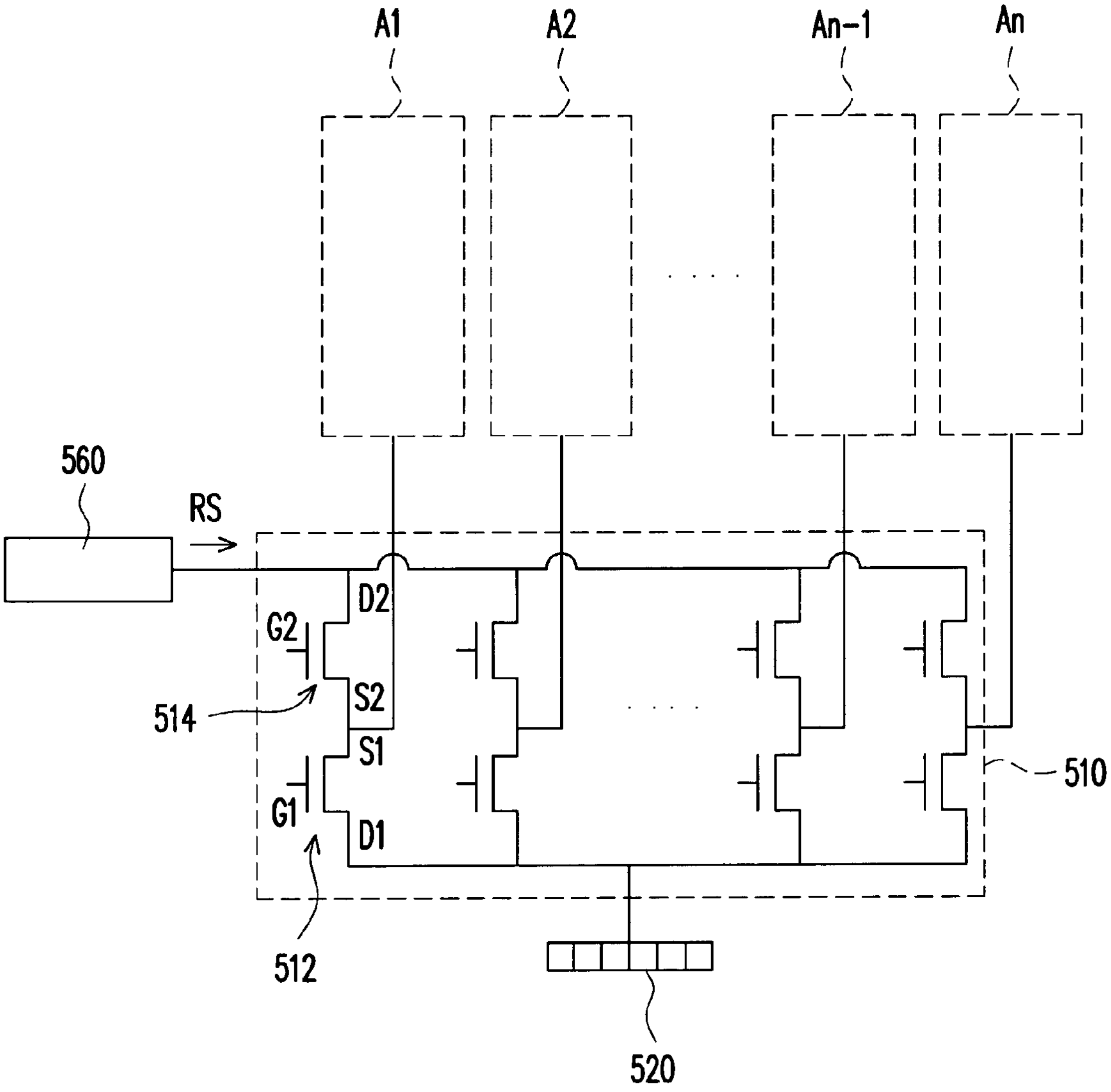
FIG. 5 is a schematic circuit diagram of a MUX shown in FIG. 4.

FIG. 5 is a schematic circuit diagram of a MUX shown in FIG. 4. Referring to FIG. 5, the MUX 510 comprises a plurality of control transistors 512. Each of the control transistors 512 has a drain electrode D1 electrically connected with the inspecting pad 520 and a source electrode S1 electrically connected with the first signal lines 504*a* of the given corresponding group of panel units 502.

Referring to FIGS. 4 and 5, according to the embodiment, the panel units 502 of FIG. 4 are divided into groups from A1, A2, . . . , An−1, An. In this embodiment, the first signal lines 504*a* are scan lines, and the MUX 510 is adapted for conducting the inspecting pad 520 with first signal lines 504*a* of a group of panel units 502 selectively. Therefore, the panel units 502 arranged in the same column are divided into one group.

Consequently, when the panel units 502 of group A1 are to be inspected, a set of probes (not shown) are pressed against the inspecting pad 520 and the selective signal pad 530. Inspecting signals IS and selective signals SS can be input from an external circuit to the inspecting circuit layout 500 via the probes (not shown). According to the selective signals SS, the MUX 510 applies a voltage to a gate electrode G1 of a control transistor 512 that is electrically connected with the panel units 502 of group A1, thus enabling the control transistor 512. Therefore, the inspecting signals IS are transferred from the inspecting pad 520 to the panel units 502 of group A1 to be inspected via respectively the drain electrode D1 and the source electrode S1 of the control transistor 512, and the first signal lines 504*a* in sequence. In this embodiment, the first signal lines 504*a* are scan lines, therefore, after the inspecting signal IS is transmitted to the panel unit 502 of group A1, the only thing to do is to input a data signal to the data lines of all of the panel units 502. Accordingly, operators can identify whether the panel units 502 of group A1 are qualified or not according to the performance of each panel units 502.

Further, the MUX 510 according to the embodiment can include a plurality of refresh transistors 514. Each of the refresh transistors 514 includes a source electrode S2 electrically connected between the source electrode S1 of a corresponding control transistor 512 and the first signal lines 504*a*, and a drain electrode D2 electrically connected to a refresh signal supplying unit 560. After inspecting the panel units 502 of group A1, if panel units 502 of another group are to be further inspected, the control transistor 512 connected to the panel units of group A1 is then turned off and the refresh transistor 514 is turned on. Therefore, a refresh signal (RS) is output from the refresh signal supplying unit 560 and input into the panel units 502 of group A1 via the drain electrode D2 and the source electrode S2 of the refresh transistor 514 in sequence, thus refreshing the inspecting signals of the panel units 502 of group A1.

Therefore, after the inspecting signals of the panel units 502 of group A1 are refreshed, the refresh transistor 514 corresponding to the group A1 is then turned off. Thereafter, panel units 502 of other groups can be inspected in the same way. Note that the probes (not shown) pressed against the inspecting pad 520 need not be moved during the process of inspecting the panel units 502 of the next group, wherein the MUX 510 selectively enables a control transistor for selecting the panel units 502 of a given group to be inspected.

It can be understood that during the process of inspecting the panel units 502 of group A1, the inspecting signals won't be transferred into panel units 502 of any other group, and accordingly only active elements of the panel units 502 of group A1, rather than any other group, are needed to remain at ON state. In other words, the inspecting circuit layout 500 according to the invention is adapted for inspecting the panel units 502 group by group to shorten the ON-state of each group of panel units 502, and avoiding the active elements of the panel units 502 from the damage of ON-state for a long time.

Figure 6:
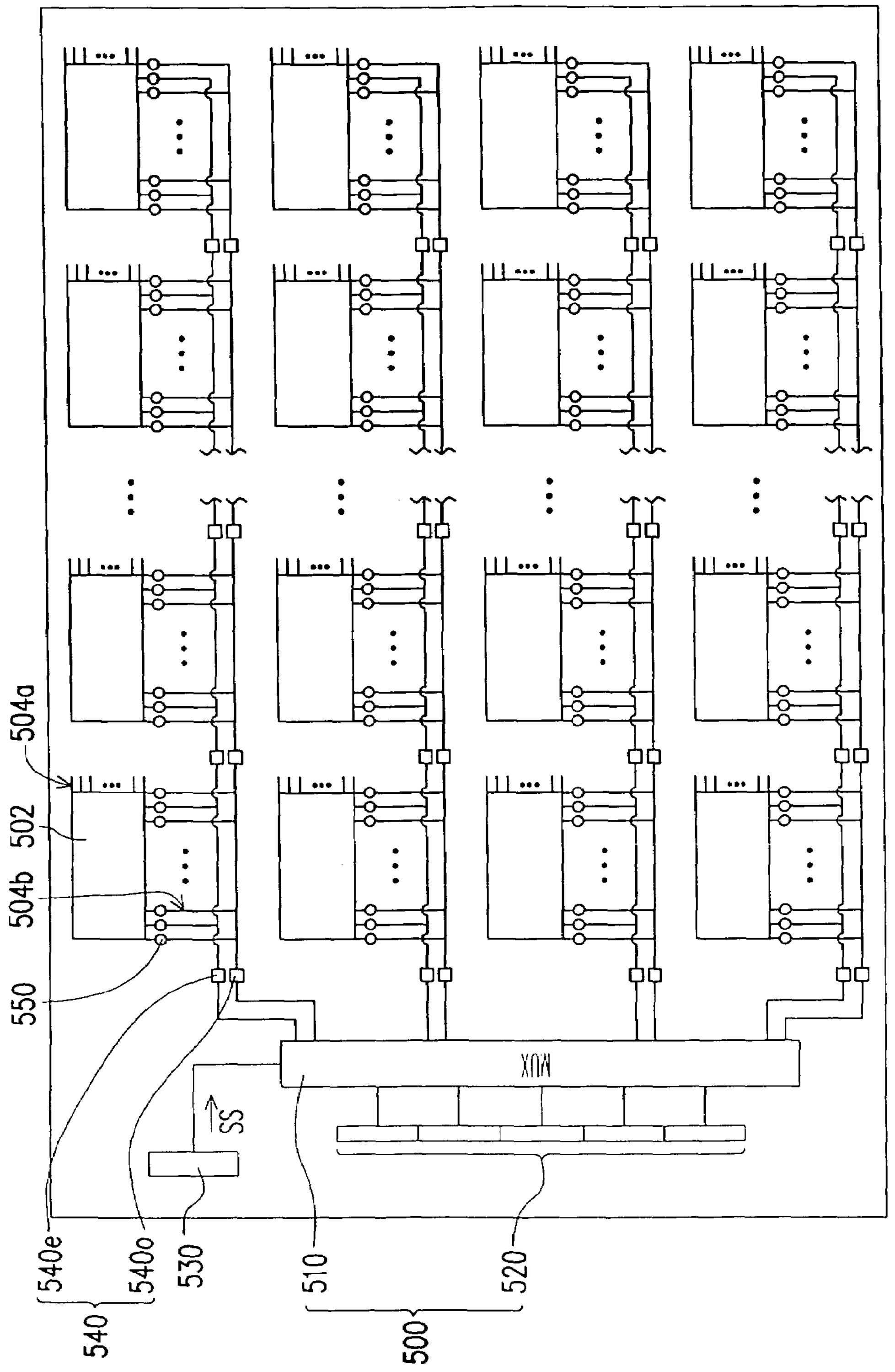
FIG. 6 is a schematic view of an inspecting circuit layout for panel unit according to a second embodiment of the invention.

It should be noted that although the MUX of the foregoing embodiment is adapted for selectively conducting the inspecting pad with the scan line of the panel unit, however, people who skilled in the art should know that the MUX 510 arranged in the inspecting circuit layout 500 can be adapted for conducting the inspecting pad 520 with the data line (the second signal line 504*b*) of the panel unit 502 as shown in FIG. 6. Further, the inspecting circuit layout of the present invention may employ two MUXs for conducting the inspecting pad with the scan line and the data line, respectively, for inspecting individual panel unit. This would be illustrated in the following embodiment.

Figure 7:
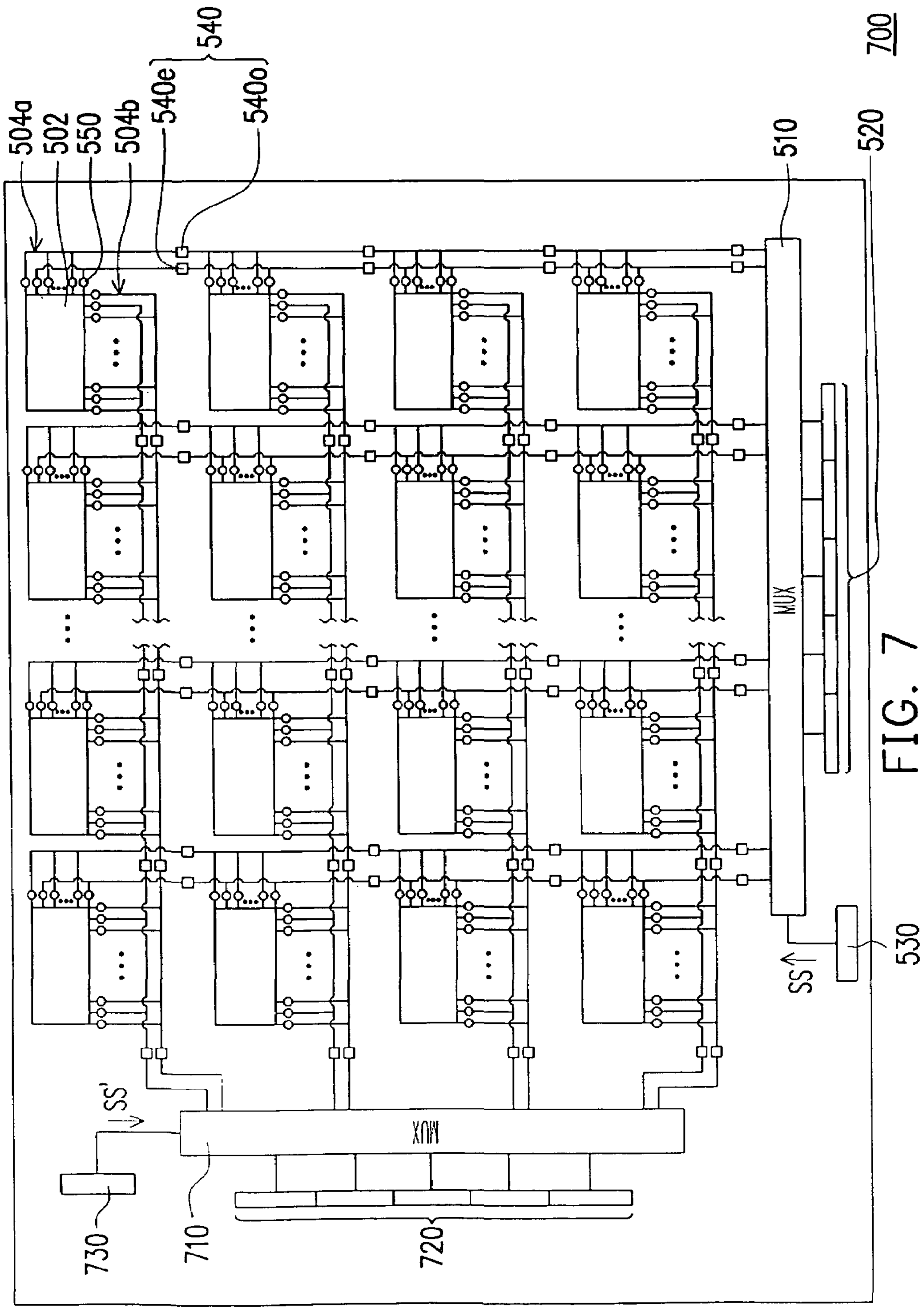
FIG. 7 is a schematic view of an inspecting circuit layout for panel unit according to a third embodiment of the invention.
Figure 8:
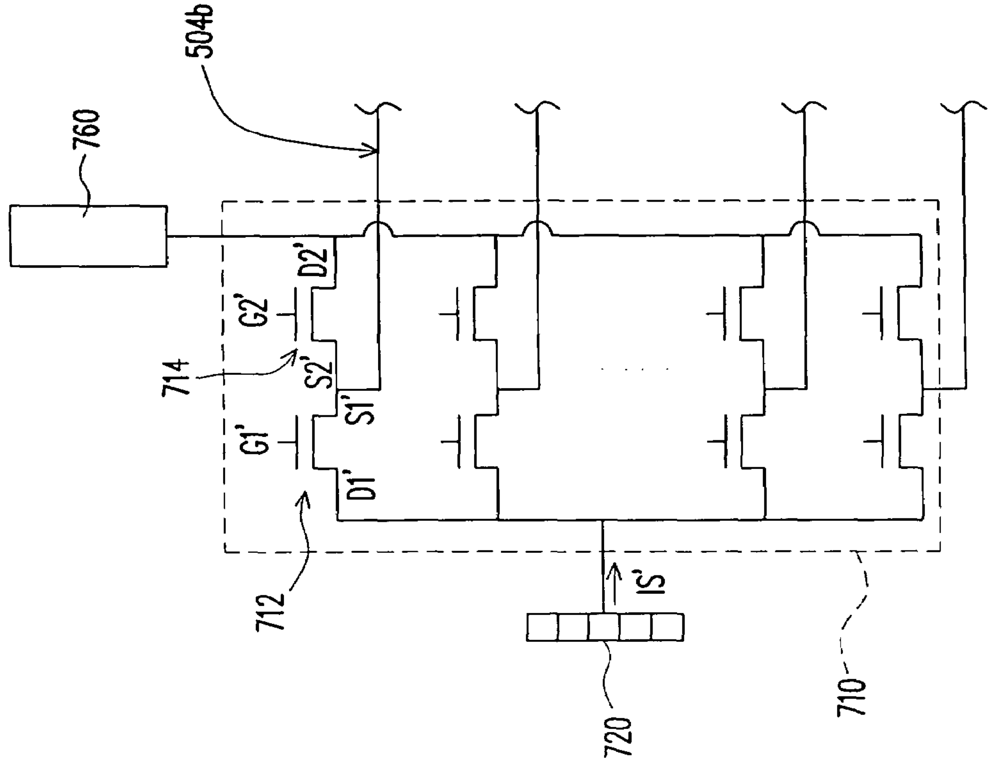
FIG. 8 is a schematic circuit diagram of a MUX shown in FIG. 7.

FIG. 7 is a schematic view of an inspecting circuit layout for panel unit according to a third embodiment of the invention. Referring to FIG. 7, except the MUX 510 and the inspecting pad 520 illustrated in the foregoing embodiment, the inspecting circuit layout 700 further includes a MUX 710 and a group of inspecting pads 720. In this embodiment, the panel units 502 are arranged in a matrix. Wherein, the MUX 510 is adapted for selectively conducting the inspecting pad 520 and the first signal line 504*a* (the scan line) of the panel unit 502 in some column; the MUX 710 is adapted for selectively conducting the inspecting pad 720 and the second signal line 504*b* (the data line) of the panel unit 502 in some row. As shown in FIG. 8, the components of the MUX 710 are almost the same as that of the MUX 510, and the MUX 710 also comprises control transistors 712 and refresh signal supplying units 760 electrically connected to the refresh transistors 714.

Please refer to FIGS. 5, 7 and 8, in this embodiment, the inspecting circuit layout 500 can be used to inspect individual panel unit 502. For example, if the panel unit 502 arranged on the first row and the first column is to be inspected, the probe (not shown) is pressed against the inspecting pad 520, the selective signal pad 530, the inspecting pad 720 and the selective signal pad 730, such that the inspecting signals IS, IS' and the selective signals SS, SS' from the external circuit can be input to the inspecting circuit layout 700 via the probe.

According to the above description, the MUX 510 applies a voltage to the gate electrode G1 of the control transistor 512 electrically connected with the panel unit 502 on the first column according to the selective signal SS, to trigger the control transistor 512. Therefore, the inspecting signal IS can be input to the panel unit 502 on the first row through the inspecting pad 520, the drain electrode D1 and the source electrode S1 of the control transistor 512, and the first signal line 504*a*. On the other hand, the MUX 710 applies a voltage to the gate electrode G1' of the control transistor 712 electrically connected with the panel unit 502 on the first row according to the selective signal SS', to trigger the control transistor 712. Therefore, the inspecting signal IS' can be input to the panel unit 502 on the first column through the inspecting pad 720, the drain electrode D1' and the source electrode S1' of the control transistor 712, and the second signal line 504*b*.

Since the first signal lines 504*a* of this embodiment are scan lines, therefore, after the inspecting signal IS is transmitted to the panel unit 502 on the first column, each pixel of the panel units 502 on this column would be turned on. In this embodiment, the inspecting signal IS' is transmitted to the panel units 502 on the first row, and therefore only the panel unit 502 on the first column and the first row can display frames according to the inspecting signals IS'. Therefore, operators can identify whether the panel units 502 are qualified or not according to the displayed frames.

According to the above description, the inspecting circuit layout employs a MUX 510 to connect the panel units to be inspected with the inspecting pad 520, for inspecting the panel units 502 individually or group by group. All of the panel units can be inspected without moving the probes (not shown) during the process of inspection.

The method for fabricating an LCD panel using the inspecting circuit layout incorporating with a one drop fill (ODF) process according to the invention is adapted for greatly shortening the fabricating time. The fabricating process is described below.

Figure 9A:
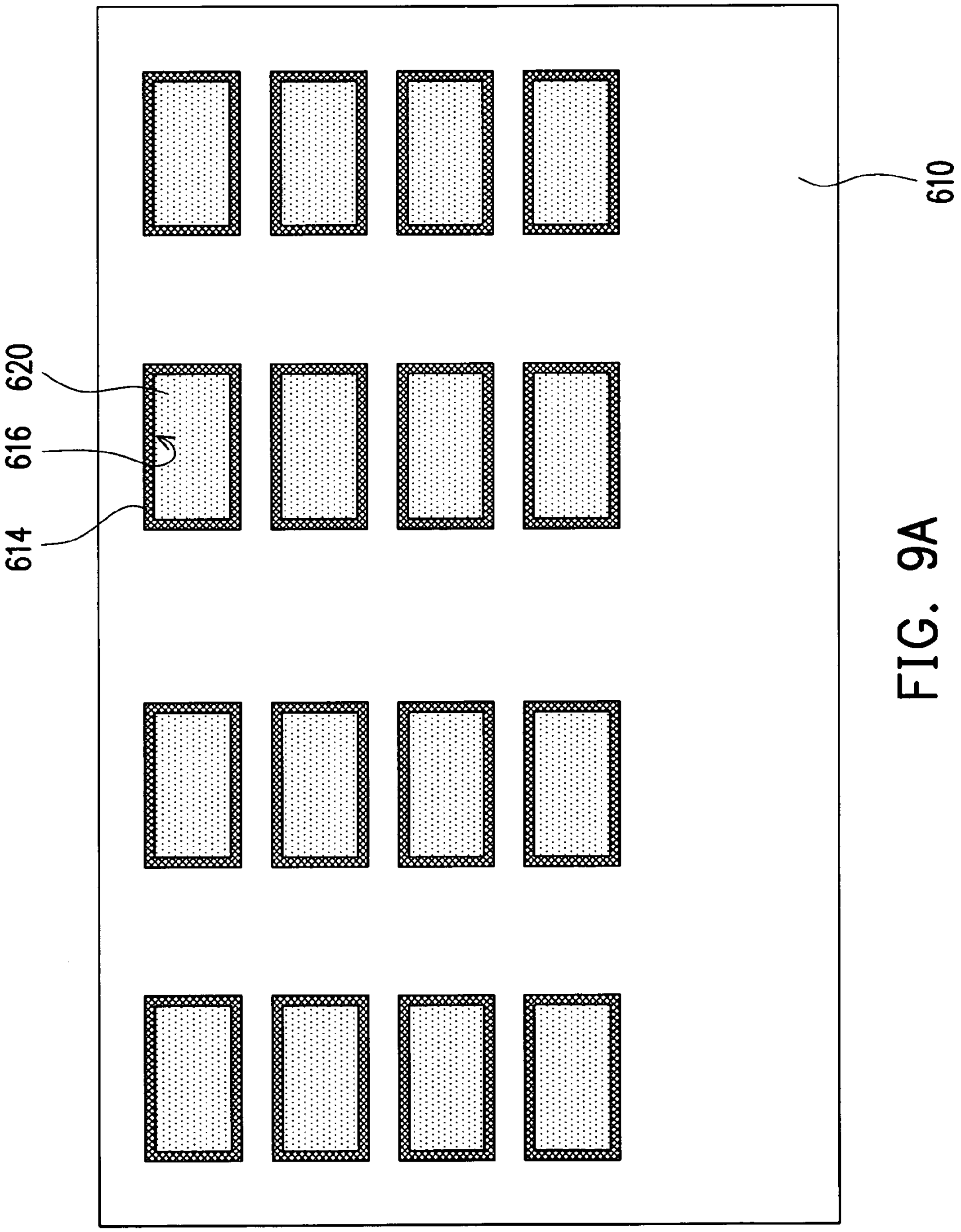
FIGS. 9A through 9C are top views of the flow for fabricating an LCD panel according to an embodiment of the invention.
Figure 9B:
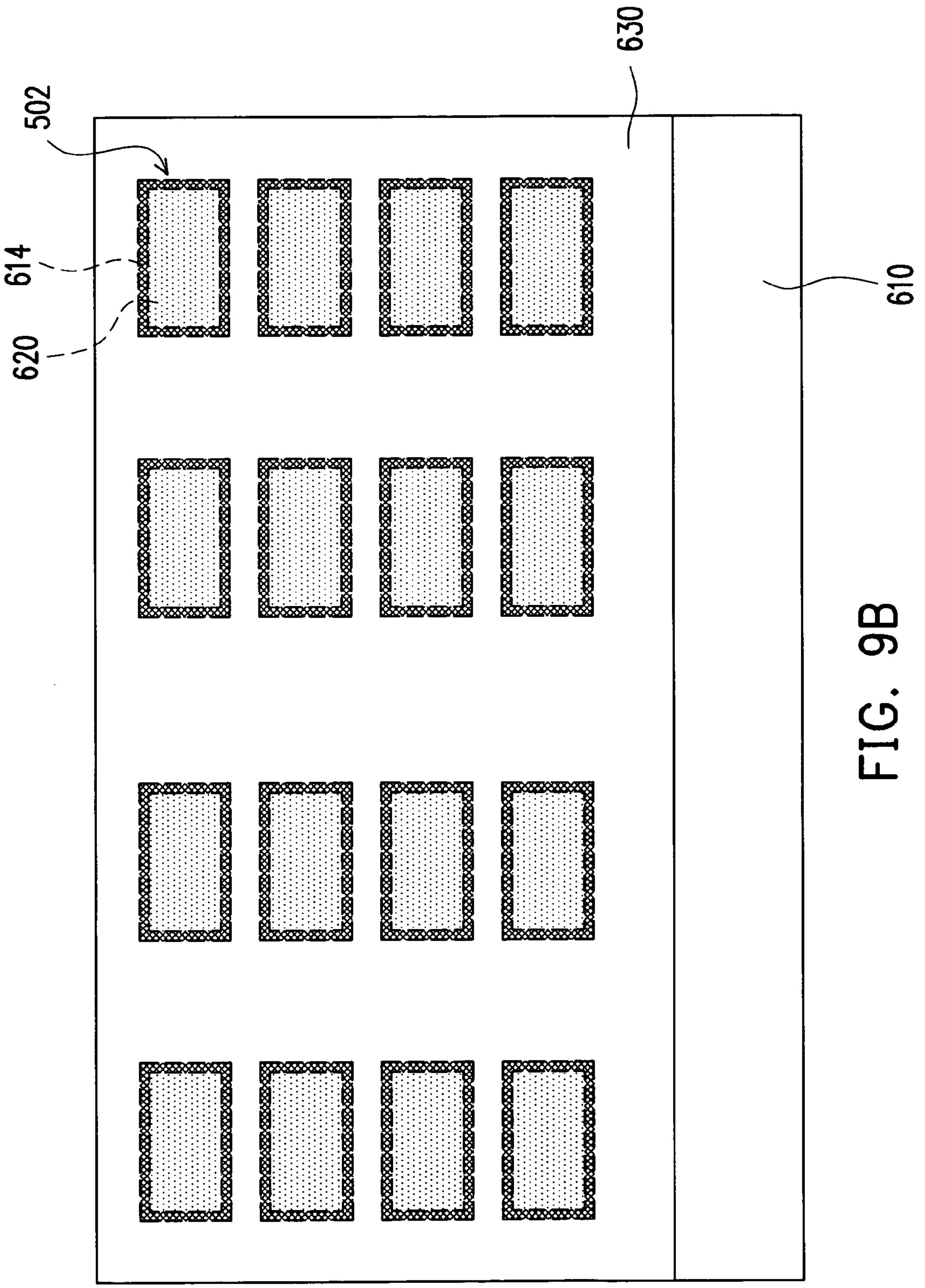
Figure 9C:
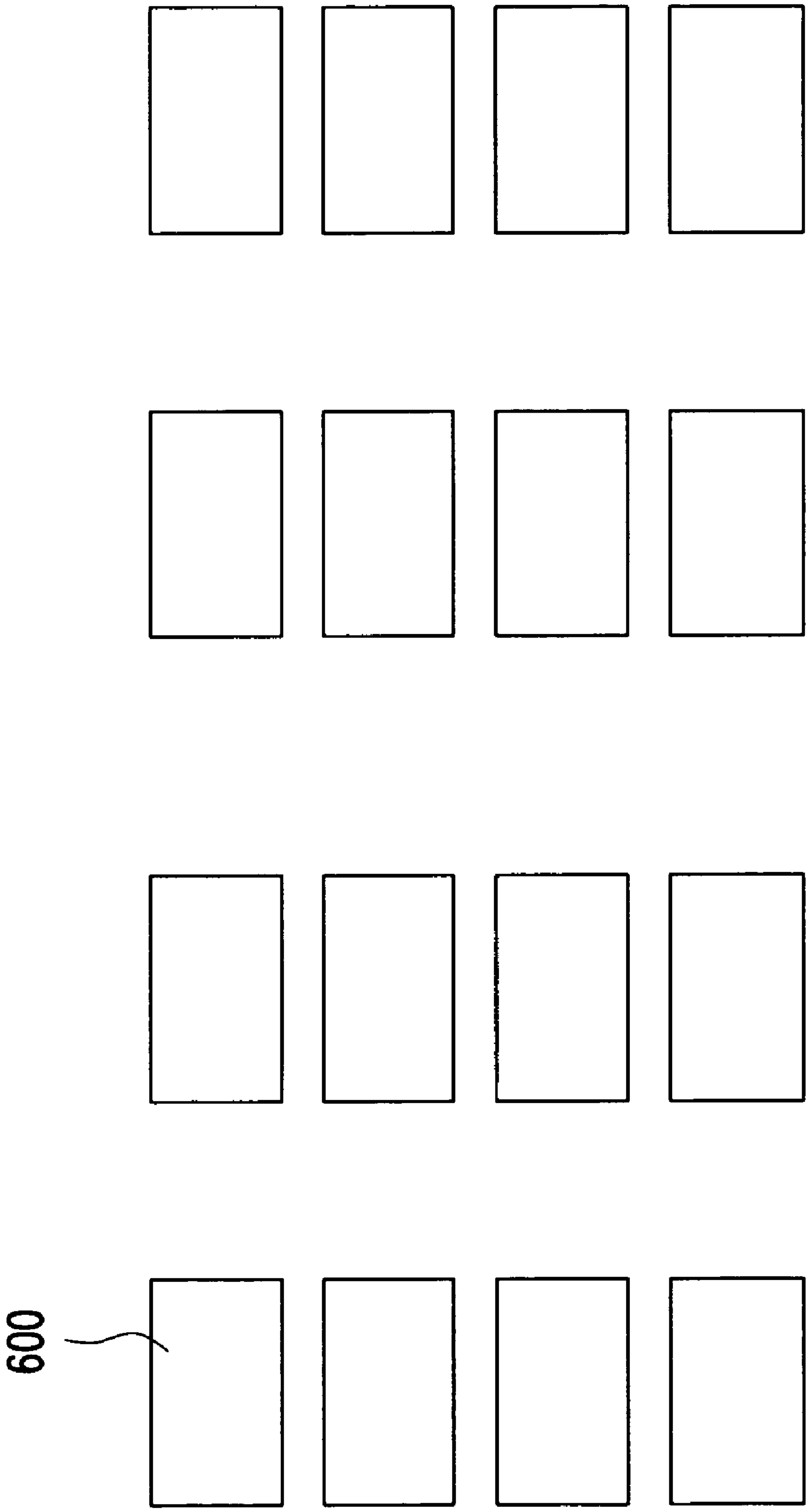

FIGS. 9A through 9C are top views of a flow for fabricating an LCD panel according to an embodiment of the invention. Referring to FIG. 9A, a liquid crystal layer 620 is formed on a first substrate 610. The first substrate 610 for example includes a plurality of active elements (not shown) distributed as an array and configured thereon, a plurality of pixel electrodes (not shown), and a sealant 614. The sealant 614 is formed on the first substrate 610 and configures a plurality of liquid crystal filling zones 616. The liquid crystal layer 620 is formed in the liquid crystal filling zones 616 in an ODF process.

As shown in FIG. 9B, a second substrate 630 is provided and disposed over the first substrate 610. The second substrate 630 for example is a color filter. The first substrate 610 and the second substrate 630 are then assembled for enclosing the liquid crystal layer 620 between the first substrate 610, the sealant 614, and the second substrate 630 and forming a plurality of panel units 502. The method for assembling the first substrate 610 and the second substrate 630 for example is by hard-pressing the first substrate 610 and the second substrate 630 and then solidifying the sealant 614 for curing the first substrate 610 and the second substrate 630. The sealant 614 according to the embodiment is either hot solidifying gel or ultraviolet solidifying gel. In other words, the method for solidifying the sealant according to the embodiment for example is either a hot solidifying process or an ultraviolet solidifying process.

After the panel units 502 are formed, an inspecting circuit layout 500 as shown in FIG. 4, 6 or 7 is formed. Then a lighting signal is input into the inspecting circuit layout for performing a lighting inspection to the panel units 502 group by group. During the process for performing the lighting inspection, the individual unit of the inspecting circuit layout and the operation mechanism of the panel units 502 are as above-illustrated and are not repeated herein.

Referring to FIG. 9C, after completing the lighting inspection of all of the panel units 502, a cutting process is performed to cut the first substrate 610 and the second substrate 630 as shown in FIG. 9B into a plurality of LCD panels 600. The subsequent process of the LCD panels 600 are known to those skilled in the art and will not be repeated herein.

In summary, the polarized light emitting device according to the present invention has at least the following advantages:

1. The inspecting circuit layout according to the present invention employs a MUX for selecting an individual or a plurality of panel units to be inspected. Therefore, the process of inspecting all of the panel units by the inspecting circuit layout according to the present invention can be completed without moving the probes pressed against the inspecting pad. Accordingly, the inspecting circuit layout according to the present invention can shorten the inspection time and consequently save the time cost. Furthermore, only one set of probes is needed for the inspecting circuit layout to complete the inspection of all of the panel units. In other words, the cost associated with probes can also be saved by using the inspecting circuit layout according to the present invention.
2. During the process of inspecting the panel units by the inspecting circuit layout according to the present invention, only the active elements of the panel units inspected need to remain at ON state and the active elements of the other panel units can be at OFF state. In other words, the inspecting circuit layout is adapted for inspecting the panel units group by group, thus shortening the ON-state time of the active elements of the panel units and improving the lifespan of the active elements.

3. According to the present invention, the lighting inspection is performed to the panel units before cutting the panel units into LCD panels. Compared with the conventional technology in which the panel units are cut into LCD panels before the lighting inspection, the present invention can simultaneously inspect a plurality of panel units and greatly shorten the time for performing light inspection to LCD panels of a same batch.

Other modifications and adaptations of the above-described preferred embodiments of the present invention may be made to meet particular requirements. This disclosure is intended to exemplify the invention without limiting its scope. All modifications that incorporate the invention disclosed in the preferred embodiment are to be construed as coming within the scope of the appended claims or the range of equivalents to which the claims are entitled.

What is claimed is:

1. An inspecting circuit layout, adapted for inspecting at least one of panel units, each of the panel units having a plurality of first signal lines and a plurality of second signal lines, the inspecting circuit layout comprising:

a first multiplexer (MUX), electrically connected with the first signal lines of the panel units;

a first inspecting pad, electrically connected to the first MUX, wherein the first MUX is adapted for selectively connecting the first inspecting pad with the first signal lines of a group of panel units; and a first refresh signal supplying unit, electrically connected to the first MUX;

wherein the first MUX comprises:

a plurality of first control transistors, each of the first control transistors comprising a drain electrode electrically connected with the first inspecting pad, and a source electrode thereof electrically connected with the first signal lines of the corresponding group of panel units; and a plurality of first refresh transistors, each of the first refresh transistors comprising a source electrode electrically connected between the source electrode of a corresponding first control transistor and the first signal lines, and a drain electrode electrically connected to the refresh signal supplying unit.

2. The inspecting circuit layout according to claim 1, further comprising a plurality of first shorting bars, electrically connected with the first MUX, each first shorting bar being electrically connected with a part or all of the first signal lines of a corresponding group of panel units.

3. The inspecting circuit layout according to claim 2, wherein the first shorting bars comprises a plurality of first odd shorting bars and a plurality of first even shorting bars, each first odd shorting bar is electrically connected with the odd first signal lines of a corresponding group of panel units, and each first even shorting bar is electrically connected with the even first signal lines of the panel unit.

4. The inspecting circuit layout according to claim 2, further comprising a plurality protecting devices used for preventing electrostatic discharge damage, each protecting device being electrically connected between the corresponding first shorting bar and a part of the first signal lines of the group of panel units.

5. The inspecting circuit layout according to claim 1, further comprising:

a second MUX, electrically connected with the second signal lines of the panel units; and a second inspecting pad, electrically connected to the second MUX, wherein the second MUX is adapted for selectively connecting the second inspecting pad with the second signal lines of a group of panel units.

6. The inspecting circuit layout according to claim 5, further comprising a plurality of second shorting bars, electrically connected with the second MUX, each second shorting bar being electrically connected with at least a part of the second signal lines of a corresponding group of panel units.

7. The inspecting circuit layout according to claim 6, wherein the second shorting bars comprises a plurality of second odd shorting bars and a plurality of second even shorting bars, each second odd shorting bar is electrically connected with the odd second signal lines of a corresponding group of panel units, and each second even shorting bar is electrically connected with the even second signal lines of the panel unit.

8. The inspecting circuit layout according to claim 6, further comprising a plurality protecting devices used for preventing electrostatic discharge damage, each protecting device being electrically connected between the corresponding second shorting bar and a part of the second signal lines of the group of panel units.

9. The inspecting circuit layout according to claim 5, wherein the second MUX comprises a plurality of second control transistors, each of the second control transistors comprising a drain electrode electrically connected with the second inspecting pad, and a source electrode electrically connected with the second signal lines of the corresponding group of panel units.

10. The inspecting circuit layout according to claim 9, further comprising a second refresh signal supplying unit, electrically connected to the second MUX.

11. The inspecting circuit layout according to claim 10, wherein the second MUX further comprises a plurality of second refresh transistors, each of the second refresh transistors comprising a source electrode electrically connected between the source electrode of a corresponding second control transistor and the second signal lines, and a drain electrode electrically connected to the refresh signal supplying unit.

12. The inspecting circuit layout according to claim 1, wherein the first signal lines are scan lines and the second signal lines are data lines.

* * * * *